United States Patent [19]
Agnello

[11] Patent Number: 5,654,570
[45] Date of Patent: Aug. 5, 1997

[54] CMOS GATE STACK

[75] Inventor: Paul David Agnello, Wappingers Falls, N.Y.

[73] Assignee: International Business Machines Corporation, Armonk, N.Y.

[21] Appl. No.: 425,945

[22] Filed: Apr. 19, 1995

[51] Int. Cl.⁶ .......................... H01L 27/76; H01L 29/94; H01L 31/062; H01L 31/113
[52] U.S. Cl. .......................... 257/338; 257/369
[58] Field of Search .......................... 257/204, 213, 257/249, 250, 262, 263, 274, 288, 331, 332, 338, 368, 369, 412

[56] References Cited

U.S. PATENT DOCUMENTS

| | | | |
|---|---|---|---|
| 4,545,116 | 10/1985 | Lau | 29/591 |
| 4,697,328 | 10/1987 | Custode | 257/412 |
| 5,057,455 | 10/1991 | Foo et al. | 437/193 |
| 5,103,272 | 4/1992 | Nishiyama | 357/23.4 |
| 5,168,332 | 12/1992 | Kunishima et al. | 257/385 |
| 5,177,570 | 1/1993 | Tanaka | 257/345 |

OTHER PUBLICATIONS

Basavaiah et al., Method to Fabricate Fet Devices, IBM Technical Disclosure Bulletin, vol. 35, No. 4A, 1992, pp. 33–34 no month.

Cronin et al., Low Sheet Resistance Gate Electrode with Conventional Borderless Contacts, IBM Technical Disclosure Bulletin, vol. 32, No. 6B, 1989, pp. 122–123 no month.

Miyake et al., Micro–Tribological Studies on Fluorinated Carbon Films, Journal of Tribology, Transactions of the ASME, vol. 113, 1991, pp. 386–389 no month.

Sah et al., Mass Spectrometric Study of Gas Evolution from Plasma–Deposited Fluorohydrogenated Amorphous Carbon Films on Heating, Thin Solid Films, Preparation and Characterization, vol., 167, 1988, pp. 255–260 no month.

Seth et al., Fluorohydrogenated amorphous carbon (a–C:H, F) films prepared by the r.f. plasma decomposition of 1,3–butadiene and carbon tetrafluoride, Thin Solid Films, vol. 230, 1993, pp. 90–94 no month.

Grill et al., Temperature and Bias Effects on the Physical and Tribological Properties of Diamond–Like Carbon, J. Electrochem. Soc., vol. 138, No. 8, 1991, pp. 2362–2367 no month.

*Primary Examiner*—Carl W. Whitehead
*Attorney, Agent, or Firm*—Pollock, Vande Sande & Priddy

[57] ABSTRACT

A gate structure in a CMOS is fabricated wherein the encapsulation material is self-aligned with the gate conductor and the gate channel. The gate conductor is formed subsequent to the device doping and heat cycles for formulation of the source and drain junction, and is preferably of greater width than the gate.

4 Claims, 6 Drawing Sheets

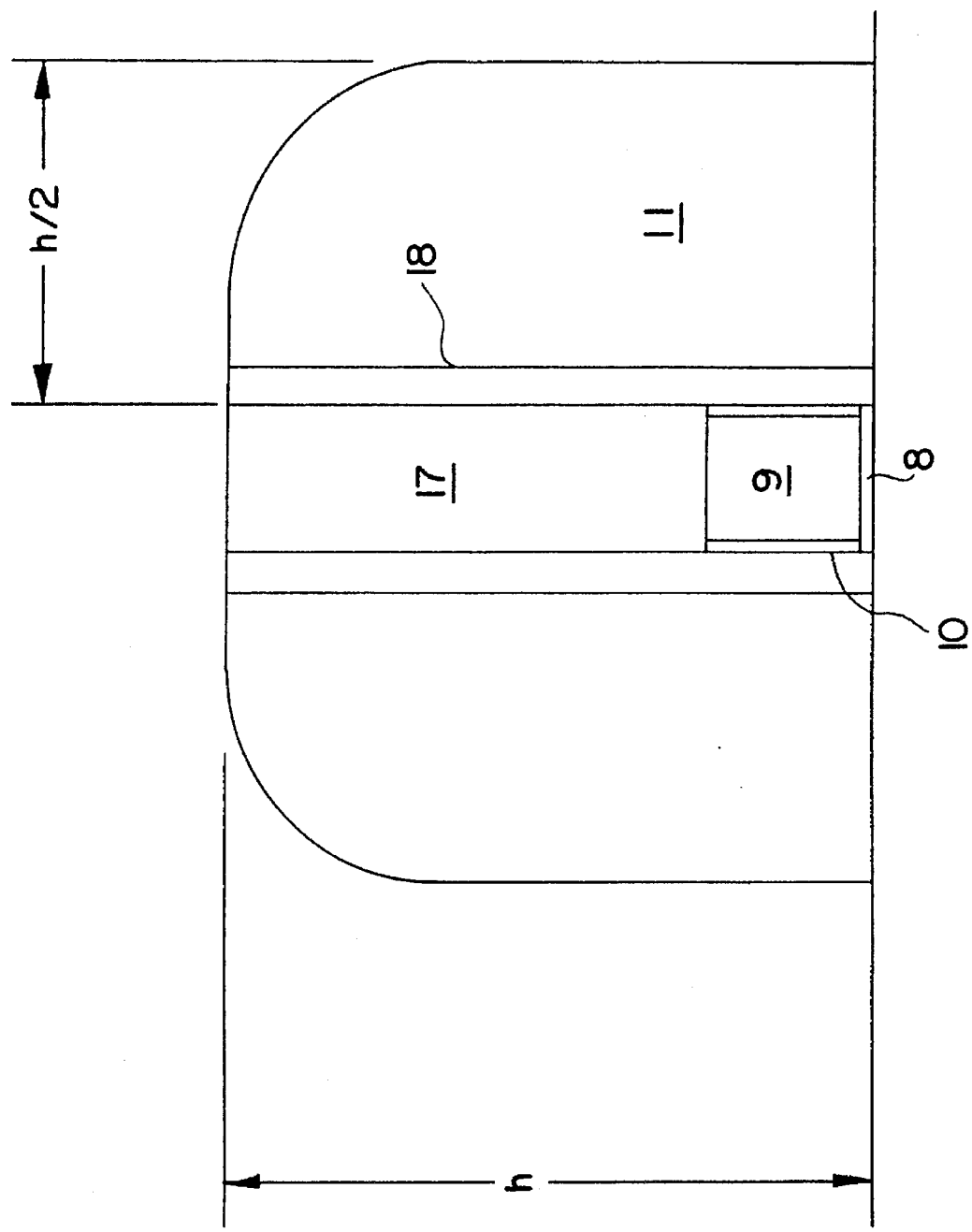

CMOS GATE STACK

DESCRIPTION

TECHNICAL FIELD

The present invention is concerned with fabricating a gate structure in a CMOS device, and is especially concerned with providing a self-aligned insulator on the gate conductor. More particularly, the present invention is concerned with a fabrication process whereby the gate conductor is not in place on the gate channel defining polysilicon until after the device doping and heat cycles required for formation of source and drain junctions are completed. In addition, the present invention is concerned with a CMOS gate stack that contain a metallic gate conductor above a polysilicon gate, wherein the metallic gate conductor is wider than the polysilicon gate.

BACKGROUND OF INVENTION

Metallic silicides have been used as an interconnection material in integrated circuits in order to overcome certain inherent disadvantages of polycrystalline silicon. The primary disadvantage of such is its minimum sheet resistivity that is about 10 ohms/square. Various metallic silicides have been used on the polycrystalline silicon because of the reduced sheet resistance, in order to improve the performance of large scale integrated circuits. The metallic silicides permit the scaling down of interconnect and gate line widths that is required to achieve very large scale integration. However, the conventional method of forming silicides on the surfaces of a polycrystalline silicon gate referred to as "Salicide" processing does not result in a self-aligned insulator on the gate conductor. Accordingly, such is not readily suitable for borderless contacts that are used in high density ULSI. On the other, polycide gate conductors, while incorporating the insulating cap for borderless contacts, are extremely difficult to fabricate. In particular, the conductor is put in place early in the fabrication sequence and therefore, must withstand oxidation, wet chemical cleaning and high thermal cycles.

Reference to FIG. 1 illustrate the typical starting stack in the prior art for the polycide gate process. In particular, after gate oxidation and poly deposition, a refractory metal or metal silicide (such as W, $WSI_2$ or $TiSi_2$) is deposited and capped with a dielectric such as silicon nitride ($Si_3N_4$). A diffusion barrier is sometimes employed between the gate conductor and the polysilicon to prevent interaction and transport of dopants.

The gate is then defined by photolithography and reactive ion etching and a dielectric sidewall is then formed by chemical vapor deposition followed by reactive ion etching. The resulting structure in the prior art is illustrated in FIG. 2.

FIG. 3 illustrates the contact of the substrate material with overlap to gate permitted (for increased density) with such a gate structure. The capping material and field dielectrics are selected such that the contact etch will not etch through the gate cap when sufficient etching is done to contact the substrate.

The problems encountered when fabricating such structures are numerous. First of all, the multiple layer structure as illustrated in FIG. 1 is extremely difficult to reactive ion etch without undercutting and/or line with bias due to the dissimilar materials present. In addition, after the reactive ion etching of the gate, a sidewall oxidation step is typically required, both to act as a pad oxide for a subsequent nitride sidewall, and to repair gate oxide damage. Metals such as tungsten and diffusion barriers such as titanium nitride or tantalum nitride oxidize very readily. Furthermore, wet cleans such as sulphuric acid-peroxide compositions or HuangB, acid-peroxide compositions, water-peroxide-hydrochloric acid or water-peroxide-amonium hydroxide compositions, are often used after gate reactive ion etching, in order to remove residue from the reactive ion etching. However, many of the conductors employed are etched by such solutions.

Another disadvantage is that the patterned gate must withstand the thermal cycles that are used to drive and activate the dopants for the source/drain junctions. Even for very shallow functions, these thermal cycles can be significant (e.g., about 900° C. for about 5 minutes or about 1000° C. for about 5 seconds). Materials such as titanium silicide or cobalt silicide are not stable on polycrystalline silicon for these thermal cycles and therefore, require a diffusion barrier. However, the common diffusion barrier materials such as TiW, TiN and TiB are easily oxidized and readily attacked by the wet etchants. On the other hand, materials such as tungsten are chemically resistant but oxidize much too easily. Materials such as $WSi_2$ are more stable, but exhibit higher resistivity and therefore are not an option for deep submicron lines where sheet resistances of less than 10 ohm/square are required. Finally, in these situations, the polysilicide conductor line width is limited to be less than or equal to the gate length. Therefore, as device dimensions are scaled down, extremely high aspect ratios cannot be avoided if resistance targets remain relatively constant.

SUMMARY OF INVENTION

The present invention provides a method that overcomes above discussed deficiencies of the prior art. In particular, the method of the present invention provides a self-aligned capped conductor suitable for borderless contacts and which may be placed on the gate after all front end processing is completed. Accordingly, the self-aligned capped conductor need only withstand the much lower heat cycles and less harsh conditions experienced in the subsequent processing. According to the present invention, the conductor is placed on the gate in a self-aligned fashion so that no critical overlap steps are required. Moreover, the conductor contains a dielectric cap that allows the implementation of borderless contacting. A further advantage of the present invention is that the gate conductor can be fabricated so that its width is greater than the width of the gate polycrystalline silicon. This in turn eliminates conventional scaling limitations.

More particularly, the present invention is concerned with a process for fabricating a gate structure in a CMOS device. The process comprises forming device insulation regions in a semi-conductor substrate. Next, an N-type well region and a P-type well region is formed in the semi-conductor substrate. This is achieved by ion implantation or diffusion. A gate insulation layer is then formed over active regions of the substrate as defined by the previously formed device isolation regions. A gate forming layer is provided above the gate isolation layer, and a sacrificial gate cap is deposited over the gate forming layer. The gate forming layer is doped either before the sacrificial gate cap material is deposited or after it is removed later in the process. The sacrificial gate cap layer is etchable at a faster rate than the surrounding dielectric material to be subsequently formed. The sacrificial gate cap and gate forming layer are etched to thereby define individual gate channel regions. The source and drain regions are next formed by ion implantation or diffusion. A sacrificial spacer layer is formed on the vertical sides of the sacrificial gate cap and gate. Next, the process involves blanket depositing interlayer dielectric material to a depth that is at least equal to the gate stack height and planarizing the interlayer dielectric. This interlayer dielectric is etchable at a rate that is slower than that of the sacrificial gate cap.

The sacrificial gate cap is removed and a self-aligned metallic gate conductor is then deposited above the polycrystalline silicon gate. The gate conductor is selectively etched to form a trench and a cap dielectric is blanket deposited and thereby self-aligned on the gate conductor. The gate dielectric is etchable at a rate that is slower than that of the interlayer dielectric.

The present invention is also concerned with a CMOS gate stack that comprises a semi-conductor substrate and device isolation regions in said substrate. A gate isolation layer is located over active regions of the substrate as defined by the device isolation regions. A polysilicon gate is located above the gate isolation layer and a self-aligned metallic gate conductor is located above the polysilicon gate. The metallic gate connector is wider than the polysilicon gate. A self-aligned cap dielectric is provided on the gate conductor.

SUMMARY OF DRAWING

FIGS. 5–8 are schematic illustrations of a gate structure pursuant to the present invention in various stages of its fabrication.

BEST AND VARIOUS MODES FOR CARRYING OUT INVENTION

Figure 1:
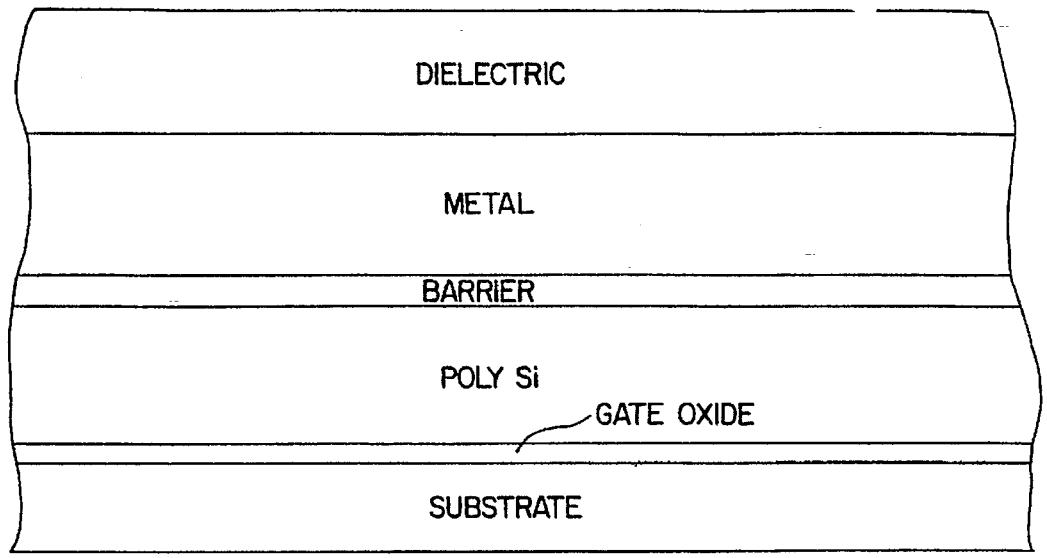
FIGS. 1–3 are schematic illustrations of prior art structures.
Figure 2:
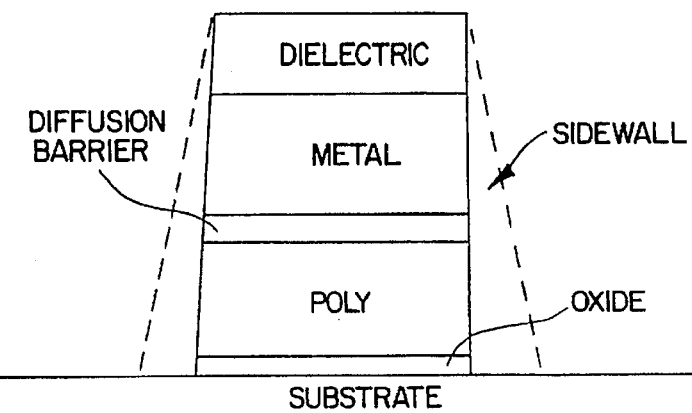
Figure 3:
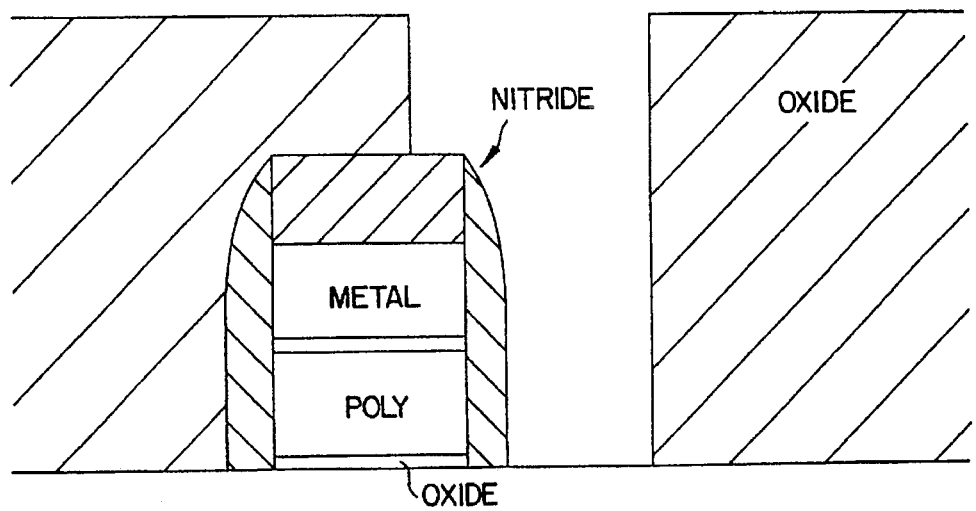
Figure 4:
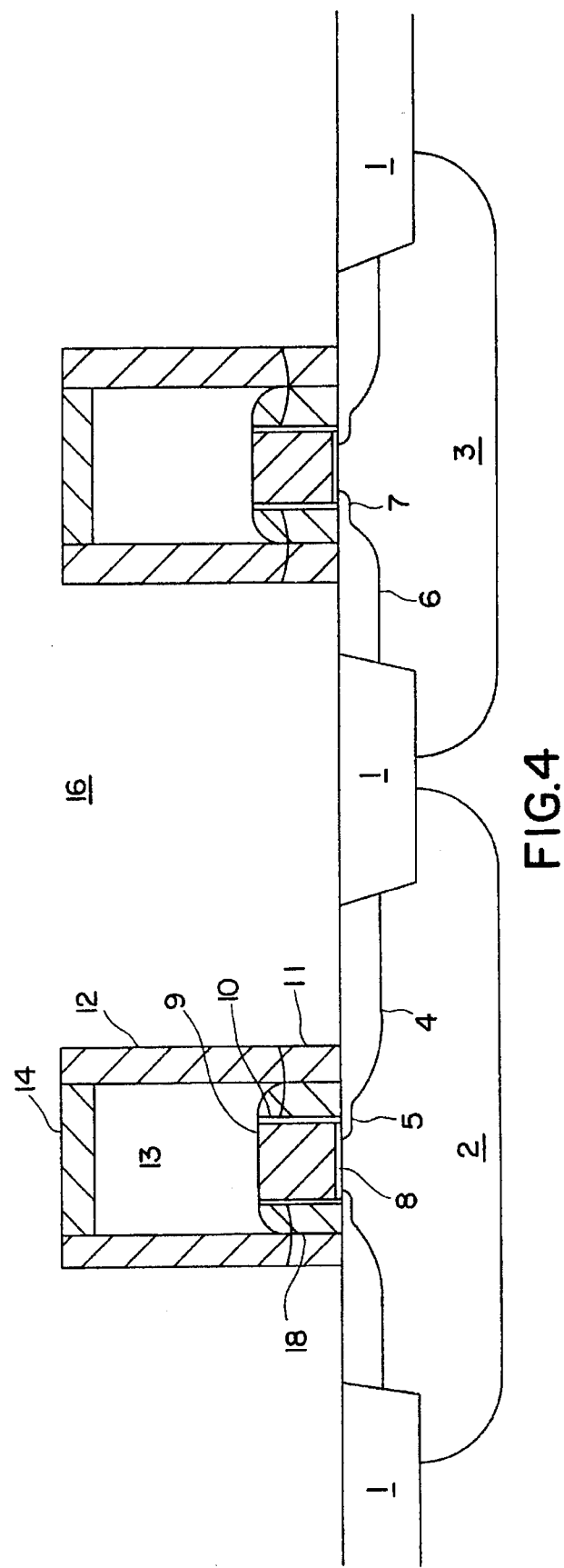
FIG. 4 is a schematic illustration of a CMOS gate structure pursuant to the present invention.
Figure 5:
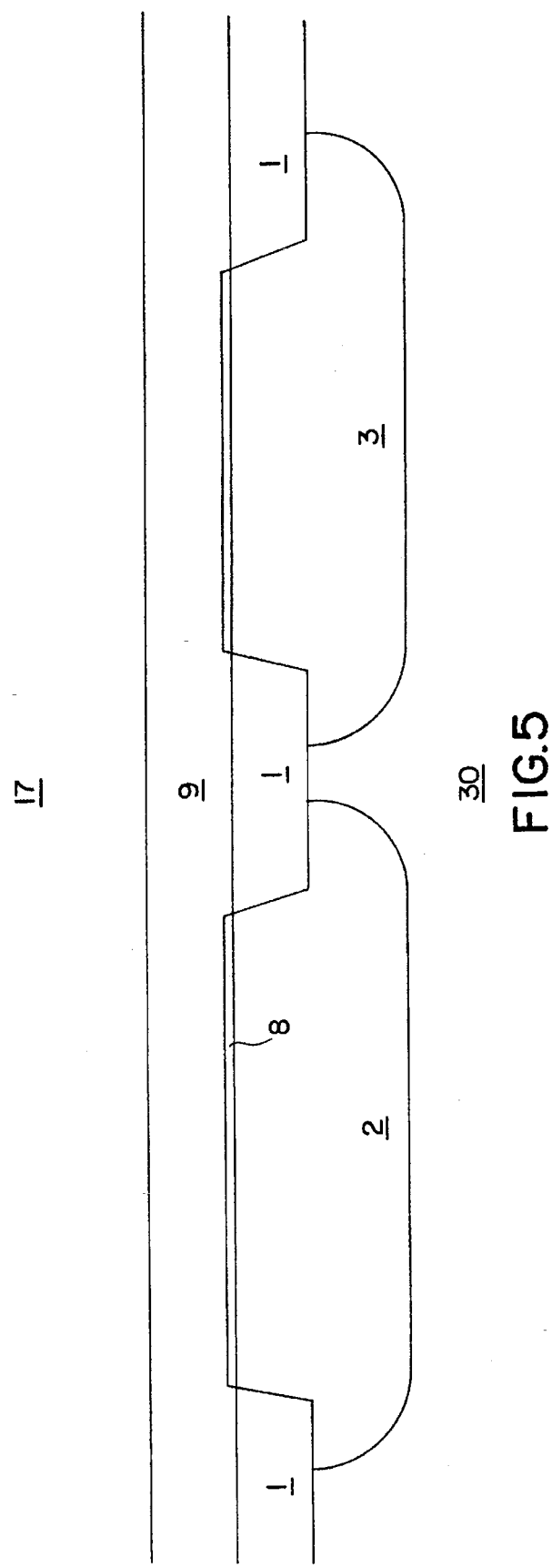

Reference to FIG. 5 illustrates a semi-conductor substrate such as a silicon substrate 30 having any desired crystal orientation (e.g., <100>), which can be prepared by slicing and polishing a silicon boule, followed by conventional crystal growth techniques.

Device isolation regions 1 are formed in the semi-conductor substrate by well known techniques, such as thermal oxidation of the semi-conductor substrate in selected regions or by a shallow trench isolation technique. Typically, the device isolation regions one are about 2000 to about 6000 angstroms thick.

Next, the formation of twin wells are formed by ion implantation or diffusion. In particular, an N-type well 2 is formed by ion implantation or diffusion of an N-type dopant, which for silicon can be phosphorous, the N-type dopant is typically formed by ion implantation or diffusion to a depth of about 8000 to about 12000 angstroms in the substrate, employing an energy level of about 400 to about 800 KeV and a dosage of about $1 \times 10^{12}$ to about $1 \times 10^{13}$ atoms/cm$^2$. Other N-type dopants include arsenic and antimony. The P-type dopant for silicon for the P-type well 3 includes boron, aluminum, gallium and indium. Such can be provided at a depth of about 10000 angstroms employing boron at an energy of about 70 to 150 KeV and dosage of about $1 \times 10_{12}$ to about $1 \times 10^{13}$ atoms/cm$^2$.

Next, a gate isolation layer 8 such as silicon dioxide is deposited or grown over the active regions of the substrate as defined by device isolation regions one. This gate insulator, which is typically about 30 to about 120 angstroms thick, is preferably of silicon dioxide and can be formed by thermal oxidation of the silicon substrate, for instance, at about 800° to 900° C. in the presence of dry oxygen, or at about 750° to 850° C. in the presence of oxygen mixed with steam.

A layer of polycrystalline silicon 9 is then deposited. This polycrystalline silicon layer 9 is typically about 500 to about 3500 angstroms thick, and may be formed by chemical-vapor deposition. The polycrystalline silicon layer 9 can be doped by ion implantation or some other means. For instance, such is typically doped with both N-type and P-type dopants in different regions of the wafers through the use of photolithographic masking and ion implantation. The wafers could then be annealed at this stage of the process, if desired. This decoupling of the gate anneal from the source/drain anneal can result in improved gate activation without resulting in deeper source/drain junctions. However, gate RIE becomes more difficult when the gate dopant is activated, thus depending on the gate etching process, one may choose to leave the dopants un-annealed at this step. Doping via POCl$_3$ or by insitu doping during poly deposition is also possible, though less attractive because it becomes difficult to obtain both dopant polarities by this means.

A sacrificial gate cap layer 17 is deposited over the polycrystalline silicon layer 9. This gate cap material is preferably a dielectric materials but does not need to be so, since it will be subsequently removed in the process. However, the material must be selected such that it is etchable at a rate that is faster than the rate for surrounding dielectric material that will be subsequently formed on the structure.

In the case where the interlayer dielectric material 16 (hereinafter referred to as ILD) is chosen to be SiO$_2$ or SiO$_2$ doped with F, P or B or a combination of the above, a preferred sacrificial gate cap material is Si$_3$N$_4$. Other suitable materials include, but as those skilled in the art will realize, are not limited to BN, SiOBN and SiBN. The sacrificial dielectric is chosen for its ease of removal relative to the ILD to be deposited later. It is necessary that this material be capable of withstanding the subsequent gate source/drain thermal cycle. It must be selectively etchable so that the gate material and interlayer dielectric is not removed during its removal.

A different sacrificial dielectric would be chosen for a different class of ILD, for example, organic materials. If low dielectric constant polyamide or other organic materials, such as Teflon are chosen as ILD, then the sacrificial dielectric material could include those listed above and in addition could include SiO$_2$ based materials.

Considering the case of a SiO$_2$ based ILD in more detail, the material for the gate cap dielectric is preferably Si$_3$N$_4$ and is typically about 2000 to 4000 angstroms thick, and preferably about 2700 to 3300 angstroms thick.

Figure 6:
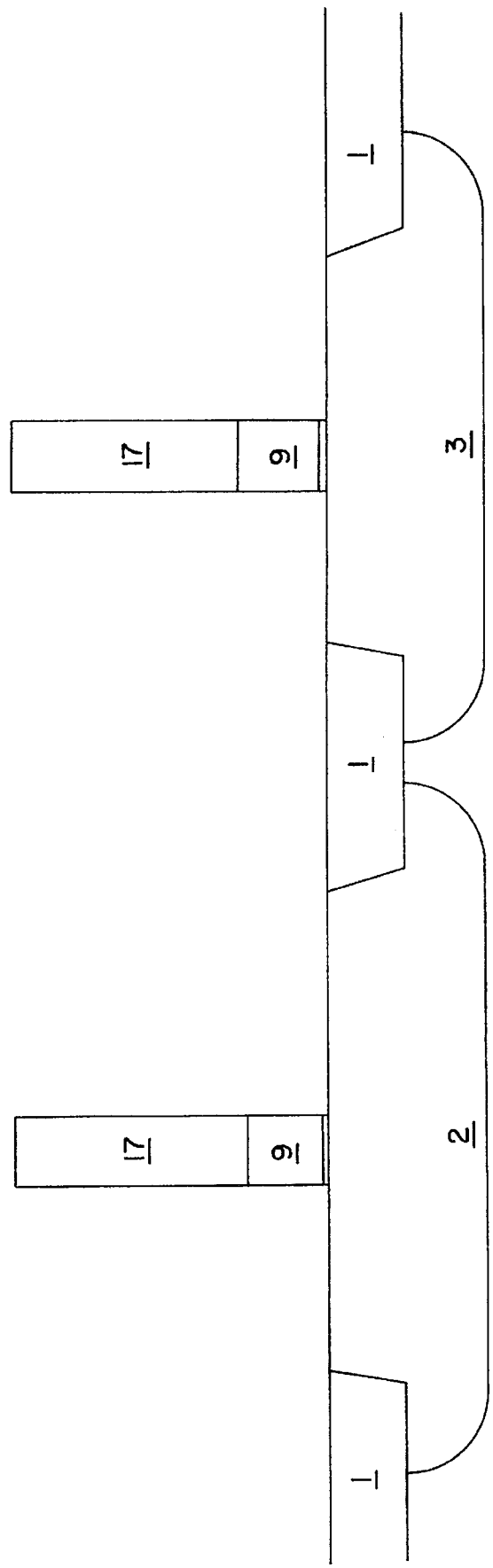

The sacrificial gate cap 17 and polycrystalline silicon gate layer 9 are then delineated by employing conventional photolithographic patterning techniques followed reactive ion etching, as the preferred method of etching (see FIG. 6). If desired, the sacrificial gate cap 17 can be protected against any undue line width growth during the reactive ion etching by coating on top of it a relatively hard masking layer, such as a layer of polycrystalline silicon (not shown).

The reactive ion etching typically employs a chemically reactive gas mixture containing CHF$_3$ and O$_2$ to each the dielectric. This process is typically carded out at a power of several hundred watts and a pressure of 50 mTorr. An emission endpoint, such as disclosed by L. Chen, U.S. Pat. No. 4,493,745, disclosure of which is incorporated herein by reference, could be used to detect SiN species in the plasma and terminate the etch when the polysilicon is reached and the SiN signal is reduced. Other suitable gas chemistries for etching the dielectric may include replacing $CHF_3$ with $NF_3$ or other compounds containing F.

Following etching of the dielectric cap material, the polysilicon is etched. The polysilicon etch can be carried out in a chemistry of HCl, He and $O_2$ at a pressure of less than 20 mTorr and a power in the range of 100 to 200 Watts. In this case, the Cl signal is monitored for emission endpoint on the gate oxide. Alternatively, if the resist can be stripped after the dielectric cap is removed, then a HBr gas chemistry at a power of 100 to 200 watts and a pressure of less than 10 mTorr can be used. In either case, it is preferred that the two etching steps be carried out in a clustered tool (multiple process chambers attached to a common high vacuum central handler) so that the poly surface is not exposed to atmosphere before it is etched. This allows for etch chemistries that etch $SiO_2$ very slowly (such as disclosed above) to be utilized.

This procedure defines the individual CMOS channels as illustrated in FIG. 6.

Convention chemical cleaning to remove reactive ion etching residue and oxidation to form a reoxidizing layer 10, can be carried out. Chemical cleaning can include dilute HF etching and etching in sulphuric/peroxide or other acidic or basic peroxide mixtures.

Figure 7:
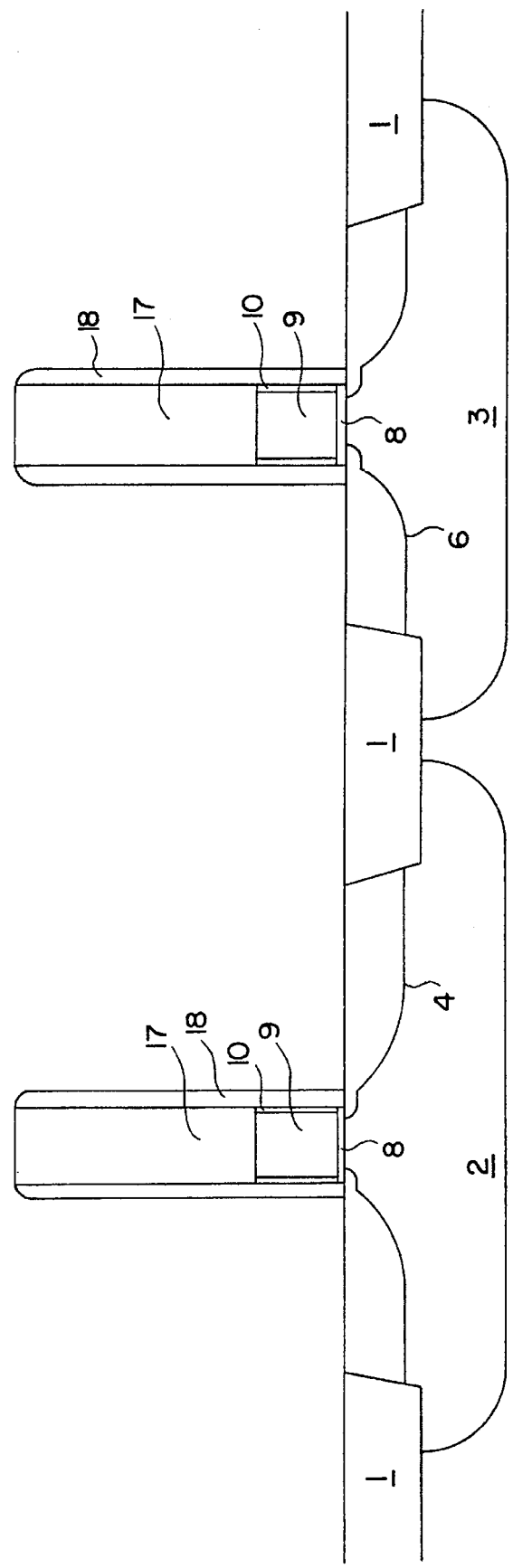

The N-type FET and p-type FET source and drain regions 4 and 6 are formed by ion implantation and annealing or conventional thermal diffusion processing (see FIG. 7). This doping can be carried out employing a p-type dopant, such as boron, aluminum, gallium and indium at a dosage of about $1 \times 10^{15}$ to about $5 \times 10^{15}$ atoms/cm$^2$, using an ion implantation energy of about 10 KeV of boron for the p-FET. For the N-type FET, a dopant such as phosphorous, arsenic or antimony at a dosage of about $3 \times 10^{15}$ atoms/cm$^2$ of As employing an ion implantation energy of about 25 KeV can be used. The annealing to typically carried out at temperatures of about 950° to about 1100° C., and more typically at about 1000° to about 1050° C.

Next, gate sidewall spacers 18, can be provided by chemical vapor deposition following by reactive ion etching. The sidewalls are typically about 500 to about 2000 angstroms thick. The choice of sidewall spacer material is subject to the same considerations as that of the gate cap, described earlier, if the spacers are to be sacrificial. One embodiment, described later, does not require that the spacers be sacrificial. However, this is the least preferred embodiment, because the resulting gate conductor will be narrower than the gate itself. The reactive ion etching employed can be by the technique disclosed in U.S. Pat. No. 4,283,249 to Ephrath, disclosure of which is incorporated herein by reference, or by derivatives of this technique which employ a gas mixture of $CHF_3$ (or other flurohydrocarbon) and $O_2$ (or other oxygen containing species such as CO) at a power of several hundred watts. Emission endpoint based on the SiN line emitted from the plasma during etch is usually used to determine when the etch has completed etching the $Si_3N_4$. Such reactive ion etching selectively etches the nitride at a much greater rate than that of the substrate. The gate sidewall spacers provide for source/drain extensions, halos or lightly doped drains (hereinafter LDD). If desired, after LDD halos or source/drain extension processing, an additional spacer can be formed following similar processing to the first spacer as detailed above. This spacer formation is typically carried out only if additional spacer width, over that which may already be present due to the gate sidewall spacer, is desired. For practical purposes, the widest total spacer width is approximately ½ the height of the gate stack, including the sacrificial gate cap 17. The width of the gate plus the spacers will ultimately determine the width of the gate conductor to be subsequently provided. The wider the spacer, the better. However, such is limited to provide sufficient source and drain contact areas. FIG. 8 illustrates the widest practical gate stack.

Next, interlayer dielectric 16 is blanketed deposited over the entire wafer. The depth of the dielectric layer 16 is at least equal to and can be greater than the gate stack height. The interlayer dielectric material is selected such that it can be planarized to the top of the gate stack by chemical/mechanical polishing or any other known technique. Such must be etchable at a rate slower than that of the sacrificial gate cap and sacrificial spacer material. An example of such is a TEOS based oxide is an oxide deposited from tetraethylorthosilicate (hereinafter referred to as TEOS) in a mixture with $O_3$ (Ozone) at a temperature of approximately 400° C. when employing as the sacrificial dielectric silicon nitride. Other suitable materials include TEOS/Ozone based oxides doped with phosphorous, boron or flourine or a combination of the above or flowable or spin on oxides. The second class of ILDs includes polyamides and other flurohydrocarbon materials which can be deposited by spin on techniques or by chemical vapor deposition. This class of materials allows the use of $SiO_2$ based materials as the sacrificial dielectric layers as described previously.

To prevent dishing of the interlayer dielectric 16, dummy gate shapes may be placed in the field as is common practice. This technique involves patterning additional gate shapes, during the gate definition stage of the process, that are situated over isolation regions 1, of the wafer. As such, they have no electrical purpose in the ULSI circuit, but instead provide a uniform pattern factor of gate shapes distributed over the chip to enable more uniform planarization of the ILD. The planarization also may result in some removal of the sacrificial cap material and sacrificial sidewall isolation.

Next, the sacrificial gate cap 17 is removed. Along with its removal, the sacrificial sidewalls can be completely or partially removed or can be left intact. The removal of the sacrificial gate cap is carried out selectively, with respect to the interlayer dielectric, the gate polycrystalline silicon, and in one particular instance, with respect to the source and drain material. Removal of the sacrificial gate cap can be achieved by dry etching, such as reactive ion etching or by wet etching. A particular preferred removal process is reactive ion etching in any of the nitride etch chemistries disclosed earlier for spacer formation. These chemistries have moderate selectivity to Si and $SiO_2$. Improved selectivity can be obtained by etching in a $Cl_2/O_2$ gas mixture as disclosed in U.S. Pat. No. 4,832,787 to J. A. Bondur, disclosure of which is incorporated herein by reference. This particular etch process has very high etch rate ratios of $Si_3N_4$ with respect to $SiO_2$, but will not stop on Si. If this chemistry is to be used, a thin (approximately 100 Å) layer of $SiO_2$ layer should first have been deposited between the gate forming layer 9, and the sacrificial dielectric 17. It will provide a good stopping layer for the $Si_3N_4$ etch and can be removed via a wet etch in dilute HF or by dry etching processes.

In the least preferred embodiment of the present invention, the sacrificial gate cap material only is removed and the sidewall spacers are left intact. In this situation, the sidewall spacer material must be selected so that such is not sacrificial. One such material is $SiO_2$. In this arrangement, the selective etch of the sacrificial gate cap material is selective to the polycrystalline silicon gate and interlayer dielectric and automatically stops on top of the gate polycrystalline silicon. This embodiment is the least preferred since it provides a gate conductor that is of lesser or equal width to the gate polycrystalline.

In an alternative embodiment, the sacrificial gate cap layer is completely removed, while the sidewall spacers are only partially etched. In this embodiment, the sidewall spacers are sacrificial and would be of a material that is similar to the sacrificial gate type material, such as silicon nitride or other materials that can be etched selectively to $SiO_2$ and Poly Si as discussed previously. To carry out this embodiment, the selective etch (selective to the polycrystalline silicon and interlayer dielectric) is a timed or emission endpointed etch with an over etch to assure that the top of the polycrystalline is uncovered, but is limited to assure that the source/drain regions are not exposed. This embodiment achieves the maximum width gate conductor.

In a still further embodiment, both the sacrificial gate cap and sidewall spacers are completely removed. In this embodiment, the sidewall spacers are sacrificial and would be a material similar to the sacrificial gate cap material. In this situation, the selective etch (selective to the polycrystalline silicon, source/drain regions and interlayer dielectric) stops on top of the polycrystalline silicon and the source and drain regions. When employing this alternative embodiment, the gate conductor liner to the subsequently deposited, must be deposited at a thickness which is at least about one-half the thickness of the space between the gate polycrystalline silicon sidewall and the interlayer dielectric, in order to protect the exposed source and drain regions from the gate conductor to be deposited subsequently. This embodiment makes it possible to provide a gate conductor to be wider than the gate conductor by twice the liner thickness.

In the latter two embodiments as discussed above, conductor liner sidewall deposition and reactive ion etching formation is carried out subsequent to the removal of the sacrificial gate cap and spacer. Suitable materials for the conductor liner sidewall include silicon nitride. Other suitable materials are silicon dioxide, boron nitride or other dielectric materials that can be deposited conformal and etched to form a spacer. If the spacer material is $Si_3N_4$, the spacer RIE process to be used could be the same as used to form the sacrificial spacer described earlier.

If desired, the gate polycrystalline silicon can be doped at this stage of the process rather than the previous doping discussed above. If doped at this stage, then such would also be annealed. The annealing is carried at temperatures of about 900° to about 1100° C. for about 5 to 60 seconds and is controlled so as to minimize dopant penetration through the gate oxide. This is beneficial since it reduces the possibility of dopant motion through the gate oxide into the channel region of the device, which in turn could cause uncontrolled device behavior.

The gate conductor 13, such as titanium tantalum, aluminum or any other suitable metal, such as tungsten, copper, titanium, and aluminium, is deposited and subsequently planarized. The deposition can be by any conventional method, such as chemical vapor deposition, sputter deposition, evaporation or plating. In addition, the deposition can be blanket deposition or selective deposition. One preferred method for depositing W is by CVD by silane and hydrogen reduction of $WF_6$ at a temperature of around 400° C. To prevent reaction of the volatile fluoride species with the underlying Poly Si and Si a sputtered Ti/TiN barrier layer of several hundred angstroms thickness may be deposited first. The planarization can be achieved by reactive ion etching etchback or by chemical/mechanical polishing or any other known technique. CMP typically involves polishing the W surface with an acidic slurry containing nm sized abrasive particles such as alumina.

Next, the conductor is selectively recessed so as to form a trench into which a gate cap dielectric can be subsequently and planarized. Preferably, the recess is to a depth approximately equal to the desired cap dielectric thickness. For instance, when employing W, this can be carried with a high degree of selectivity to oxide and nitride using a $SF_6$ oxygen gas mixture at a power of 400 Watts and a pressure of about 100 mTorr.

In the next step, a layer of cap dielectric 14 is blanket deposited. Preferably, the thickness of the cap dielectric is about 1 to 1 ½ times the depth of the recess. A suitable cap dielectric is silicon nitride. Such is then subjected to a chemical/mechanical polishing in order to formed the desired cap.

Next, an additional interlayer dielectric 18 is then deposited, which if desired, can be planarized.

Following the above sequence results in the CMOS gate stack of the present invention.

What is claimed is:

1. A CMOS gate stack comprising a semiconductor substrate;

device isolation regions on or in said substrate or both on and in said substrate;

gate isolation layer over active regions of said substrate as defined by said device isolation regions;

polysilicon gate located above said gate isolation layer;

self-aligned metallic gate conductor above said polysilicon gate wherein said metallic gate conductor is wider than said polysilicon gate.

2. The gate stack of claim 1 wherein said substrate is silicon.

3. The gate stack of claim 1 wherein said device isolation regions is silicon dioxide.

4. The gate stack of claim 1 which further comprises a cap dielectric.

* * * * *